United States Patent [19]

Ibaugh

[11] 4,306,188
[45] Dec. 15, 1981

[54] PHOTOMULTIPLIER TUBE HAVING A PHOTOCURRENT COLLECTOR

[75] Inventor: James L. Ibaugh, Landisville, Pa.

[73] Assignee: RCA Corporation, New York, N.Y.

[21] Appl. No.: 89,314

[22] Filed: Oct. 30, 1979

[51] Int. Cl.³ .................. G01R 31/22; H01J 9/22; B05D 5/12
[52] U.S. Cl. .................................. 324/409; 316/5; 427/74
[58] Field of Search .............. 324/403, 405, 409; 316/1, 3, 4, 5, 6, 7, 8, 10; 29/593, 25.14; 427/74

[56] References Cited

U.S. PATENT DOCUMENTS

| | | | |
|---|---|---|---|
| 2,770,561 | 11/1956 | Sommer | 427/74 |
| 3,434,876 | 3/1969 | Stoudenheimer et al. | 313/373 |
| 3,658,400 | 4/1972 | Helvy | 316/5 |
| 3,838,304 | 9/1974 | McDonie | 316/5 |

*Primary Examiner*—Ernest F. Karlsen
*Attorney, Agent, or Firm*—Eugene M. Whitacre; Dennis H. Irlbeck; Vincent J. Coughlin, Jr.

[57] ABSTRACT

An electron discharge device includes an envelope with a primary electrode and substances for forming a photocathode therein. A photocurrent collector is provided which is electrically insulated from the photocathode and the primary electrode. The photocurrent collector is independent of the electrical leakage between the photocathode and the primary electrode encountered during formation of the photocathode and permits the sensitivity of the photocathode to be maximized.

8 Claims, 6 Drawing Figures

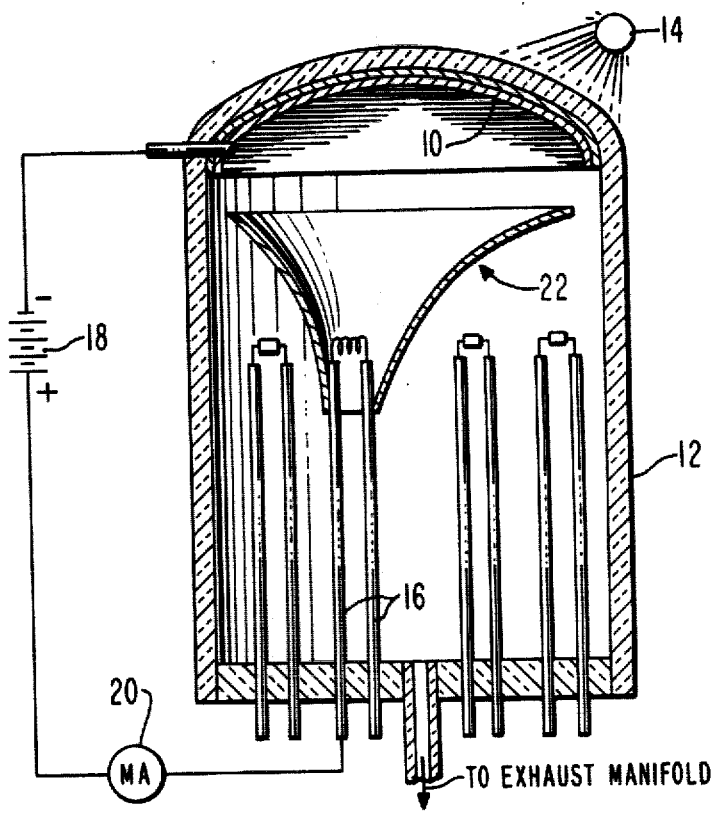
Fig. 1.
PRIOR ART
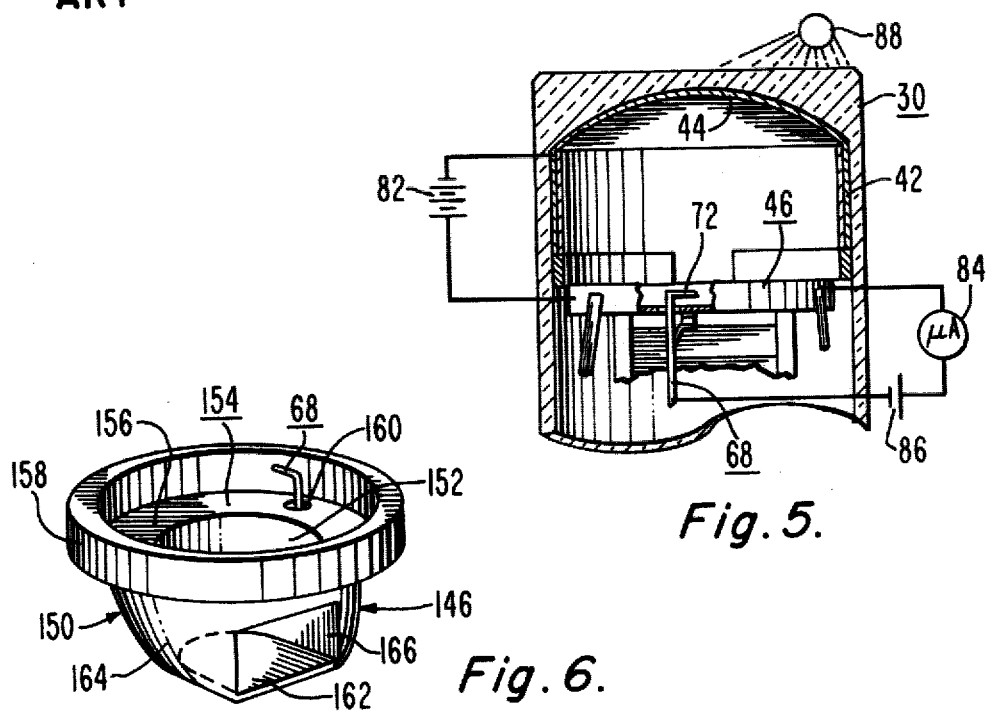
Fig. 5.
Fig. 6.

PHOTOMULTIPLIER TUBE HAVING A PHOTOCURRENT COLLECTOR

BACKGROUND OF THE INVENTION

The present invention relates to photomultiplier tubes and particularly to an improved sensing means for monitoring the current due to photoelectrons emitted from a photocathode during the formation thereof.

In the prior art it has been found that bialkali and multialkali photocathodes with improved photocathode sensitivity may be made by carefully monitoring the photocurrent during each step of the photocathode formation process (see for example U.S. Pat. Nos. 3,838,304 issued Sept. 24, 1974 to A. F. McDonie for "Method of Making A Bialkali Photocathode With Improved Sensitivity and High Temperature Operating Characteristics," and 3,658,400 issued Apr. 25, 1972 to F. A. Helvy for "Method of Making A Multialkali Photocathode With Improved Sensitivity To Infrared Light And A Photocathode Made Thereby.") A typical photocurrent monitoring curcuit is shown in U.S. Pat. No. 3,434,876 issued Mar. 25, 1969 to R. G. Stoudenheimer et al for "Photosensitive Cathode." The monitoring circuit is reproduced as prior art FIG. 1.

As shown in FIG. 1, photoemission from a photocathode 10 within an envelope 12 is accomplished by locating a light source 14 adjacent to the photocathode 10.

The photocathode 10 is made negative with respect to a pair of leads 16 by means of a potential source 18. A microammeter 20 is connected in series in the circuit of the potential source 18 to measure any electron discharge between the photocathode 10 and the positive leads 16 which are connected to a primary electrode 22 which serves as an anode or sensing electrode. The sensitivity of the photocathode is expressed in terms of microamperes of emitted electron current per lumen of light incident on the photocathode 10.

In the prior art it has been noted that a substantial electrical leakage or "dark" current occurs during formation of the photocathode. The "dark" current is believed to be caused to some extend by thermionic emission of electrons from the photocathode but predominantly by a current of ionized alkali gases which form conductive paths in the region between the photocathode on the wall of the envelope and the sensing electrode. The dark current is undesirable because it is sometimes mistaken as a true signal. It also persists during the presence of a light input to the photomultiplier tube, thereby creating a spurious signal in the presence of the true signal such that the output of the tube is obscured because of a poor signal-to-noise ratio. The problem has been sufficiently acute, especially during the initial alkali evaporation steps when the photocathode sensitivity is low, that the resulting photomultiplier tubes do not have the desired optimum sensitivity or reproducibility of sensitivity from one tube to the next that is required.

SUMMARY OF THE INVENTION

An electron discharge device includes an envelope, a primary electrode and a photocathode within the envelope. A sensing means electrically insulated from the photocathode and the primary electrode is independent of the electrical leakage encountered between said photocathode and said primary electrode during the formation of said photocathode.

BRIEF DESCRIPTION OF THE DRAWINGS

FIG. 1 is a schematic view of a prior art photomultiplier tube and a monitoring circuit.

FIG. 5 is a schematic view of a photomultiplier tube and the sensing means of the present invention.

FIG. 6 is a perspective view of a teacup dynode with the sensing means of the present invention.

DESCRIPTION OF THE PREFERRED EMBODIMENT

Figure 4:
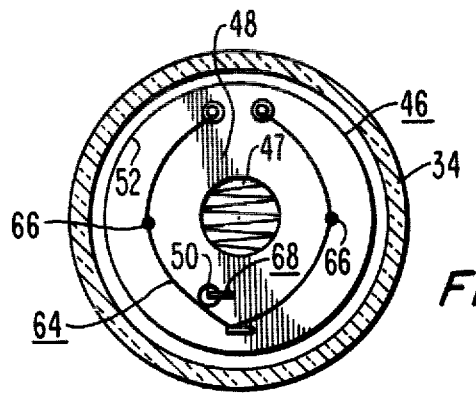
FIG. 4 is a section view of the photomultiplier tube taken along line 4—4 of FIG. 2.
Figure 2:
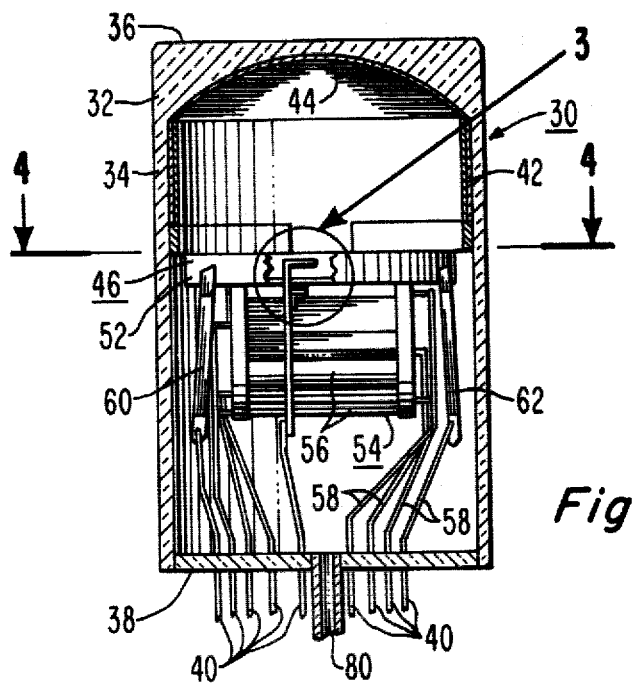
FIG. 2 is a sectional view partially broken away of a photomultiplier tube with a sensing means of the present invention.
Figure 3:
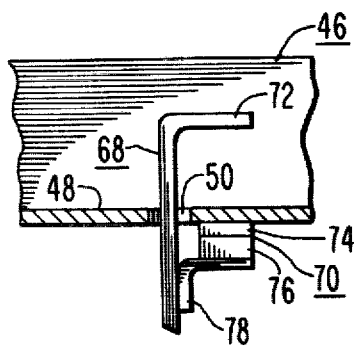
FIG. 3 is an enlarged view of the portion of the photomultiplier tube within the circle 3 of FIG. 2.

Referring to FIGS. 2-4, there is shown a photomultiplier tube 30 comprising an envelope 32 having a cylindrical sidewall 34 and a circular faceplate 36 sealed to one end of the sidewall. The other end of the envelope 32 is closed by a stem 38 having a plurality of metal pins 40 extending therethrough. An aluminized coating 42 is disposed on a portion of the sidewall 34 adjacent to the faceplate 36. Within the tube 30 is a photocathode 44 on the faceplate 36 and also along a portion of the aluminized coating 42 on the sidewall 34. The portion of the photocathode 44 on the faceplate 36 is partially transparent. The photocathode 44 may be cesium antimonide, for example, or any one of a number of bialkali or multialkali (i.e. trialkali) photocathodes well known in the art.

Inside the tube 30 is a primary electrode or aperture cup 46 which faces the faceplate 36. The aperture cup 46 has a substantially circular top opening or input aperture 47 and a substantially flat peripheral base portion 48 surrounding the input aperture 47. The cup base 48 further includes a collector aperture 50 adjacent the input aperture and a substantially cylindrical sidewall 52 forming the periphery of the aperture cup 46. The aperture cup 46 provides structural support for an electron multiplier assembly 54 attached to the bottom surface of the cup base 48. The electron multiplier 54 is in communication with the input aperture 47 of the aperture cup 46. The multiplier structure 54 includes a plurality of dynodes 56 for propagating and concatenating electron emission from the photocathode 44 to an anode (not shown). The multiplier structure 54 shown in FIG. 2 is a circular cage structure well known in the art.

A plurality of internal leads 58 are attached to the aperture cup 46 and the electron multiplier assembly 54 for placing an electrostatic charge thereon. A spring contact (not shown) extends between the photocathode 44 and a different one of the leads 58 in a manner well known in the art. Each of the leads 58 terminates at a different one of the metal pins 40 extending through the stem 38.

Along the interior of the tube and adjacent to the multiplier assembly 54 are spaced a plurality of channels which in a bialkali tube comprises channels 60 and 62. The channels are of tantalum foil containing substances for evaporating alkali metals onto the faceplate 36. In a photomultiplier tube having, for example, a bialkali photocathode, the channels 60 and 62 may contain, respectively, substances for evaporating potassium and sodium or potassium and cesium. A resistance filament 64 has two antimony alloy beads 66 situated adjacent to the aperture cup 46 but insulating therefrom for evaporating an antimony film onto the faceplate 36. The channels 60 and 62 and the filament 64 are connected by internal leads 58 to the electrical current sources through the metal pins 40 so that they can be activated separately or simultaneously by electrical resistance heating.

As shown in FIGS. 2 and 3, a novel photocurrent collector 68 comprises an insulated standoff 70 which provides mechanical support for a current collector element or antenna 72. The standoff 70 includes a conductive base 74 brazed to one surface of an insulator 76, typically of ceramic or some other suitable material. A metal support bracket 78 is brazed to the opposite surface of the insulator 76. The metal support bracket 78 is electrically insulated from the standoff base 74. The insulated standoff 70 is attached to the bottom surface of the aperture cup 46 adjacent to the collector aperture 50 in the flat peripheral base portion 48 of the aperture cup. The antenna 72 comprises a conductive lead having a right angle bend at one end thereof so that a portion of the antenna 72 is parallel to the base 48 of the aperture cup 46 and faces the photocathode 44. The antenna 72 is located such that some of the photoelectrons emitted from the photocathode 44 impinge thereon during formation of the photocathode. While the antenna 72 is described as a bent conductive lead, it should be clear to one skilled in the art that the antenna can be of any shape, such as, but not limited to, circular, triangular or T-shaped. It should also be clear that the surface area of the antenna 72 can be increased by attaching thereto, e.g., by welding, a metal member having a cross-section greater than that of the antenna.

During processing of the photocathode 44 the photomultiplier tube 30 is continuously evacuated through an exhaust tubulation 80 in the stem 38 and preferably maintained at a vacuum of $10^{-8}$ torr. In general, vacuums of $10^{-6}$ torr to $10^{-9}$ torr are considered suitable. The tubulation leads directly to a titanium evaporation ion vacuum pump (not shown) having a pumping speed of about 250 liters per second.

Techniques for monitoring light transmission during processing as well as for evaporating photoemissive materials are described, for instance in the U.S. Patents to A. H. Sommer (U.S. Pat. No. 2,770,561, issued Nov. 13, 1956), to R. G. Stoudenheimer et al (U.S. Pat. No. 3,434,876, issued Mar. 25, 1969), to A. F. McDonie referenced above and to F. A. Helvy also referenced above and incorporated by reference herein.

Sensitivity of the photocathode during formation thereof is measured and maximized utilizing the sensing means shown in FIGS. 2 and 3. The present novel sensing means differs from the prior art sensing means shown in FIG. 1 in that the novel photocurrent collector 68, by virtue of its insulation from the aperture cup 46 and placement adjacent to the input aperture 47 of the aperture cup 46, is not sensitive to extraneous dark current induced either by thermal electrons impacting on the aperture cup or by the ionized alkali gases causing ion conduction between the periphery of the aperture cup 46 adjacent to the sidewall 34 and the aluminized coating 42 on the sidewall 34. The novel sensing means thus provides a more accurate indication of the photocathode sensitivity by substantially minimizing the effects of the ionic leakage and thermic emission contributing to dark current.

The operation of the present sensing means may be better understood by reference in FIG. 5. The photocathode 44 is maintained at a negative potential (e.g. 50 to 150 volts) relative to the aperture cup 46 by a potential source 82 connected therebetween. A microammeter 84 is placed in series between the photocurrent collector 68 and the aperture cup 46. A second potential source 86 is placed in series between the collector 68 and the microammeter 84. The potential source 86 establishes a potential on the photocurrent collector 68 that is positive with respect to the photocathode 44 and slightly negative with respect to the aperture cup 46. Some of the photoelectrons emitted during the formation of the photocathode 44 in response to radiation from an incandescent tungsten light source 88 positioned adjacent to the photocathode are intercepted by and impinge upon the antenna 72 of the photocurrent collector 68. The resulting photocurrent, substantially free from dark current, may be monitored by the microammeter 84 to provide an accurate indication of the photocathode sensitivity. Photocathodes produced using the present sensing means generally have a higher sensitivity and quantum efficiency (defined as the average number of photoelectrons emitted per incident photon, stated as a percent) than photocathodes produced using prior art sensing means.

The novel photocurrent collector 68 may be incorporated into photomultiplier tubes other than the type described above. For example, in certain photomultiplier tubes the aperture cup 46 may be eliminated and replaced by a first dynode 146 having a large collection area such as that shown in FIG. 6. Such a dynode is generally referred to as a "teacup" dynode. The teacup dynode is described in detail in U.S. Pat. No. 4,112,325 to R. D. Faulkner, issued Sept. 5, 1978, and incorporated by reference herein.

Briefly, the first or teacup dynode 146 comprises a cup-shaped member 150 with an approximately circular top opening 152. A flange 154 is around the periphery of the top opening 152. The flange 154 comprises a rim 156, extending substantially in an outward radial direction from the cup-shaped member 150, and an axial member 158 extending substantially in an axial direction from the outer periphery of the rim 156. A photocurrent collector aperture 160 extends through the rim 156 adjacent to the top opening 152. The cup-shaped member 150 includes a substantially flat base 162 and a generally curved sidewall 164 which connects the base 162 to the flange 154 around the periphery of the top opening 152. An output aperture 166 extends through a flat region of the sidewall 164.

The instant photocurrent collector 68 may be utilized in photomultiplier tubes having the teacup dynode structure by locating the collector 68 adjacent to the collector aperture 160. Photocathode sensitivity of photomultiplier tubes having a teacup dynode is monitored as described above for tubes having an aperture cup except that the electrical connection is made to the teacup dynode rather than the aperture cup.

What is claimed is:

1. In an electron discharge device comprising an envelope, a photocathode within said envelope, a primary electrode in spaced relation to said photocathode, and an electron multiplier including a plurality of dynodes attached to said primary electrode, the improvement comprising:

sensing means for monitoring the photocurrent due to said photoelectrons emitted from said photocathode during the formation thereof, said sensing means being electrically insulated from said photocathode, said primary electrode and said electron multiplier so as to be independent of the electrical leakage between said photocathode and said primary electrode.

2. The device according to claim 1 wherein said sensing means includes mechanical support means attached to said primary electrode.

3. The device according to claim 2 wherein said sensing means further includes a current collector element, said current collector element being attached to said mechanical support means in such a manner as to intercept at least a portion of the photoelectrons emitted from said photocathode during formation thereof.

4. The device according to claim 2 wherein said primary electrode comprises an aperture cup having a substantially flat base portion surrounding a substantially circular top opening, said base portion of said aperture cup having an aperture therethrough, said aperture being located adjacent to said circular opening, said mechanical support means being disposed adjacent to said aperture.

5. The device according to claim 4 wherein said mechanical support means includes an insulated standoff.

6. The device according to claim 3 wherein said sensing means further includes measuring means external to said device, said measuring means includes a source of potential electrically connected between said photocathode and said primary electrode so as to attract said photoelectrons emitted from said photocathode during formation thereof to said electrode, said measuring means further includes a microammeter connected in series between said current collector element and said electrode for measuring the current due to photoelectrons impinging on said current collector element.

7. The device according to claim 2 wherein said primary electrode comprises a teacup dynode.

8. The device according to claim 3 wherein said current collector element comprises an antenna.

* * * * *